US006229756B1

(12) United States Patent
Jung et al.

(10) Patent No.: US 6,229,756 B1
(45) Date of Patent: May 8, 2001

(54) SEMICONDUCTOR MEMORY DEVICE CAPABLE OF PREVENTING MIS-OPERATION DUE TO LOAD OF COLUMN ADDRESS LINE

(75) Inventors: Jin-Kyoung Jung; Chi-wook Kim, both of Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/616,380

(22) Filed: Jul. 13, 2000

(30) Foreign Application Priority Data

Jul. 13, 1999 (KR) .................................................. 99-28206

(51) Int. Cl.$^7$ ...................................................... G11C 8/00
(52) U.S. Cl. ....................................... 365/230.06; 365/233
(58) Field of Search ................................ 365/230.06, 233

(56) References Cited

U.S. PATENT DOCUMENTS 6,055,207 * 4/2000 Nam ...................................... 365/233
6,111,795 * 8/2000 Takita et al. ......................... 365/233

* cited by examiner

Primary Examiner—Trong Phan
(74) Attorney, Agent, or Firm—Jones Volentine, L.L.C.

(57) ABSTRACT

A semiconductor memory device is provided that is capable of operating normally and having its operating speed unaffected, even when column address lines for transmitting column addresses are greatly loaded and even when the loads on the column address lines are simultaneously different from one another. The semiconductor memory device includes a column selection line driver for receiving decoded addresses and driving column selection lines of a memory cell array in response to a column selection line control signal, a column selection line control signal generator for receiving buffered column address data, and for generating the column selection line control signal in response to an internal clock signal and one of a first control signal and a second control signal, and a control signal generator for generating the first and second control signals in response to the internal clock signal, an externally-input column address strobe signal, and an externally-input write enable signal.

8 Claims, 7 Drawing Sheets

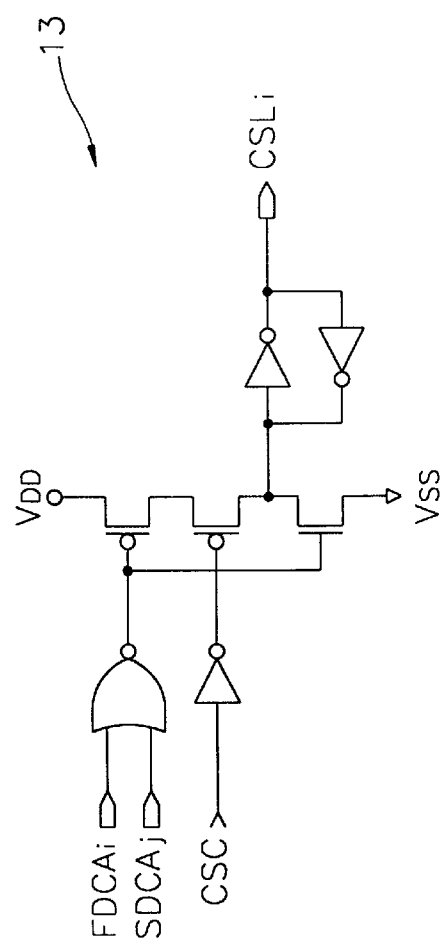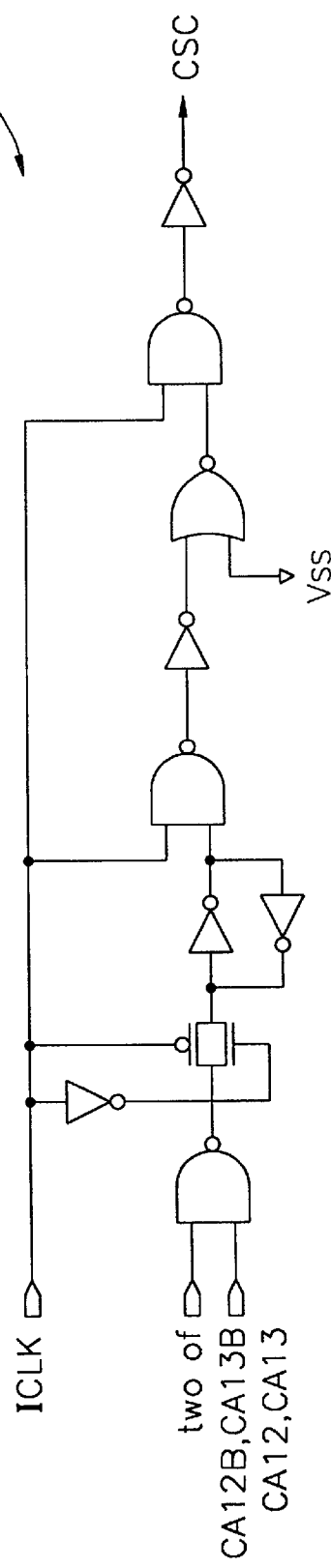
FIG. 2 (PRIOR ART)
FIG. 3 (PRIOR ART)

SEMICONDUCTOR MEMORY DEVICE CAPABLE OF PREVENTING MIS-OPERATION DUE TO LOAD OF COLUMN ADDRESS LINE

This application relies for priority upon Korean Patent Application No. 99-28206, filed on Jul. 13, 1999, the contents of which are herein incorporated by reference in their entirety.

BACKGROUND OF THE INVENTION

The present invention relates to a semiconductor memory device. More particularly, the present invention relates to a circuit for controlling a column selection line in a semiconductor memory device.

In semiconductor memory devices, and dynamic random access memories (DRAMs) in particular, as the level of integration increases, internal signal lines become longer, and their load increases accordingly. When the load of column address lines, which are internal signal lines, greatly increases, the operation speed of the device may slow down or current consumption may increase.

FIG. 1 is a block diagram schematically illustrating a conventional DRAM. Referring to FIG. 1, the conventional DRAM includes an address buffer 11, a column address decoder 12, a column selection line control signal generator 15, and a column selection line driver 13, and a memory cell array 14.

The address buffer 11 buffers externally-applied addresses $A_0$ through $A_{13}$ and provides column addresses $CA_0$ through $CA_9$, $CA_{12}$, and $CA_{13}$. The column address decoder 12 receives the column addresses $CA_0$ through $CA_9$, $CA_{12}$, and $CA_{13}$, and decodes them into first and second decoded column addresses $FDCA_i$ and $SDCA_i$. The column selection line control signal generator 15 receives the column addresses $CA_{12}$ and $CA_{13}$ and generates a column selection line control signal CSC in response to an internal clock signal ICLK. The column selection line driver 13 receives the first and second decoded addresses $FDCA_i$ and $SDCA_i$ (where i is an integer) of the column address decoder 12 and drives column selection lines $CSL_i$ (where, i is an integer) in response to the column selection line control signal CSC. These column selection lines $CSL_i$ are then provided to the memory cell array 14.

$CA_{12}$ and $CA_{13}$ denote bank selection bits when the memory cell array 14 includes a plurality of banks. The first decoded column address $FDCA_i$ denotes signals obtained by decoding $CA_0$ through $CA_2$ in the column address decoder 12, and the second decoded column address $SDCA_i$ denotes signals obtained by decoding $CA_3$ through $CA_9$ in the column address decoder 12.

FIG. 2 is a circuit diagram of a unit circuit in the column selection line driver 13 shown in FIG. 1. FIG. 3 is a circuit diagram of the column selection line control signal generator 15 shown in FIG. 1. FIG. 4 is a timing diagram of the signals shown in FIG. 2.

As described above, as the level of integration increases in a DRAM, the column address lines, which transmit the outputs of the address buffer 11, i.e., the buffered column addresses $CA_0$ through $CA_9$, $CA_{12}$, and $CA_{13}$, may be more greatly loaded. In addition, the loads of the column address lines may differ from one another.

For example, one of $CA_i$ (where i ranges from 0 to 9) may be delayed for a time $t_1$ with respect to $CA_{12}$ and $CA_{13}$ as shown in FIG. 4. This may happen because of the difference between the loads of the column address lines. FIG. 4 shows a case in which one among $CA_3$ through $CA_9$ is delayed for a period of $t_1$.

Accordingly, in the conventional DRAM, one among the second decoded column addresses $SDCA_i$, which are generated by $CA_3$ through $CA_9$, i.e., $SDCA_j$, has invalid data as indicated by the area a for a period of $t_1$. Thus, one among the column selection lines $CSL_i$, i.e., $CSL_x$, is abnormally enabled in advance as indicated by the area b. As a result of this, two column selection lines are enabled simultaneously, which causes the DRAM to malfunction.

SUMMARY OF THE INVENTION

An object of the present invention is to provide a semiconductor memory device that operates normally and is unaffected in its operating speed, even when column address lines for transmitting column addresses are greatly loaded and even when the loads on the column address lines are different from one another.

Accordingly, to achieve the above object, the present invention provides a semiconductor memory device including a memory cell array; a column selection line driver for receiving decoded addresses and driving column selection lines of the memory cell array in response to a column selection line control signal; a control signal generator for generating first and second control signals in response to an internal clock signal, an externally-input column address strobe signal, and an externally-input write enable signal; and a column selection line control signal generator for receiving first and second buffered column address data and generating the column selection line control signal in response to the internal clock signal and one of the first and second control signals.

The semiconductor memory device may comprise an address buffer for buffering externally-input column addresses and outputting the first and second buffered column address data; and a column address decoder for receiving and decoding the first and second buffered column address data and outputting the decoded addresses.

The internal clock signal preferably has a synchronous relationship with an externally-input system clock signal.

The first control signal is preferably generated in response to the column address strobe signal and the internal clock signal, and the second control signal is preferably generated in response to the write enable signal and the internal clock signal.

The column selection line control signal generator may comprise a NAND gate for selectively receiving the second buffered column address data and the inverted signals of the buffered column address data; a latch for latching the output of the NAND gate in response to the internal clock signal; and a logic unit for performing a logic operation with respect to the output of the latch and the first and second control signals, in response to the internal clock signal.

The first buffered column address data preferably includes the $0^{th}$ through $9^{th}$ bits of the column address, and the second buffered column address data includes the $12^{th}$ and $13^{th}$ bits of the column address.

The control signal generator may comprise a first inverter for inverting the column address strobe signal; a first switch for transferring the output of the first inverter in response to the internal clock signal; a first AND gate for performing an AND operation with respect to the internal clock signal and the output of the first switch, and outputting the result as the first control signal; a second inverter for inverting the write enable signal; a second switch for transferring the output of the second inverter in response to the internal clock signal; and a second AND gate for performing an AND operation with respect to the internal clock signal and the output of the second switch, and outputting the result as the second control signal.

BRIEF DESCRIPTION OF THE DRAWINGS

The above objective and advantage of the present invention will become more apparent by describing in detail a preferred embodiment thereof with reference to the attached drawings in which:

FIG. 2 is a circuit diagram illustrating a unit circuit in the column selection line driver shown in FIG. 1;

FIG. 3 is a circuit diagram illustrating the column selection line control signal generator shown in FIG. 1;

DESCRIPTION OF THE PREFERRED EMBODIMENTS

Figure 1:
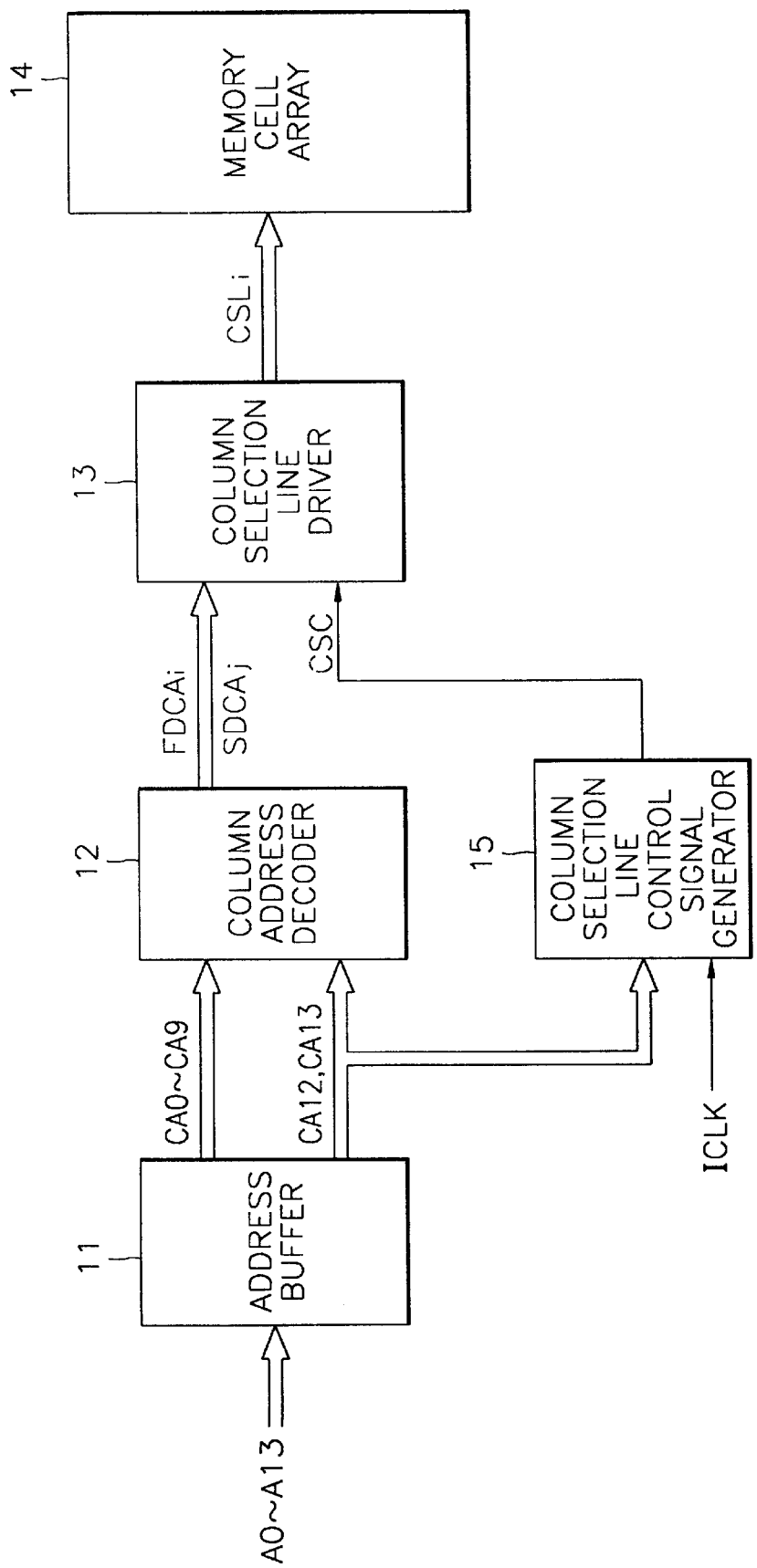
FIG. 1 is a block diagram schematically illustrating a conventional DRAM.
Figure 4:
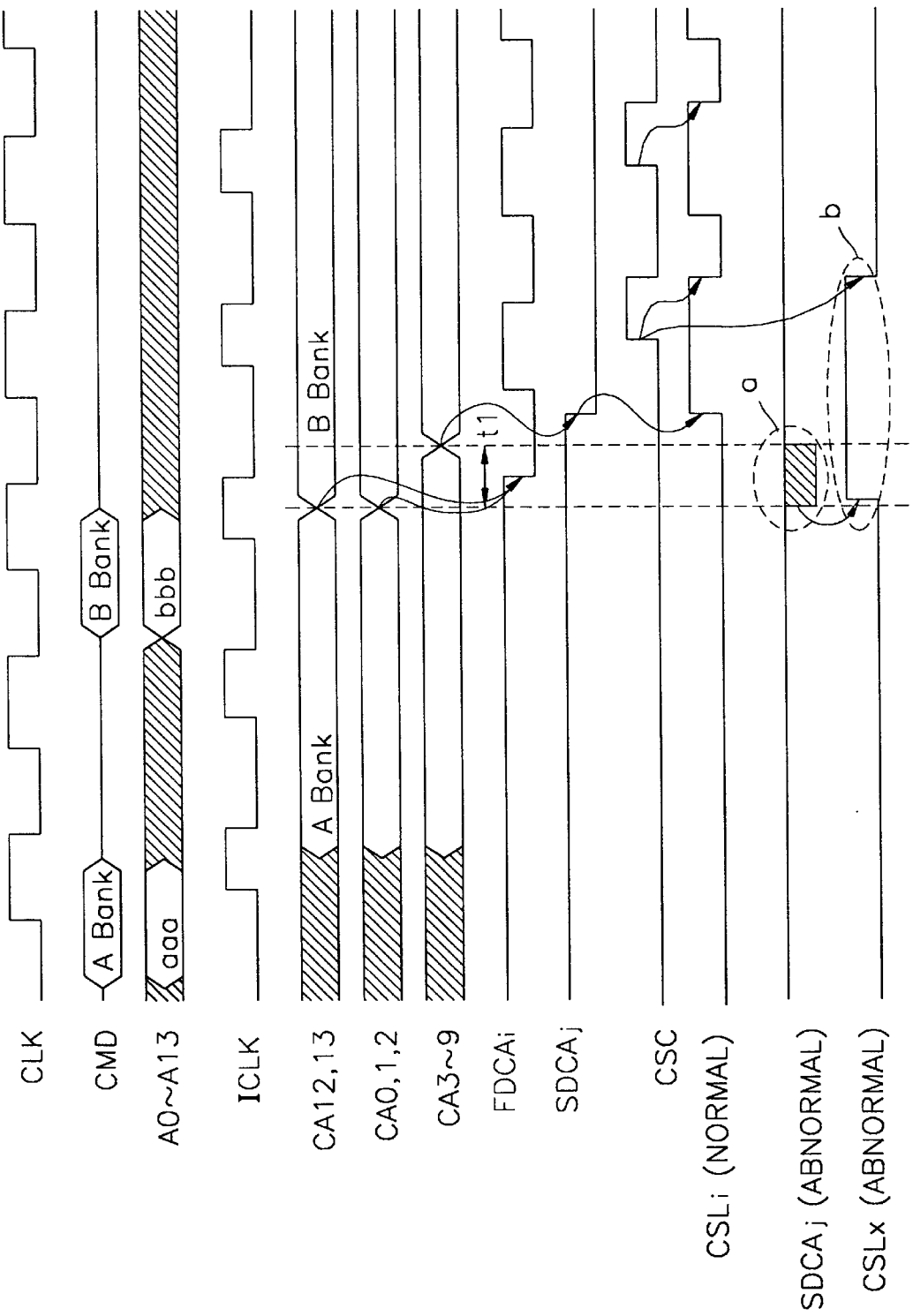
FIG. 4 is a timing diagram illustrating the signals shown in FIG. 2.

The attached drawings illustrate a preferred embodiment of the present invention, and the contents of the attached drawings must be referred to in order to gain a sufficient understanding of the merits of the present invention, its operation, and the objectives accomplished by the operation of the present invention.

Hereinafter, the present invention will be described in detail by explaining a preferred embodiment with reference to the attached drawings. Like reference numerals in the drawings denote the same elements.

Figure 5:
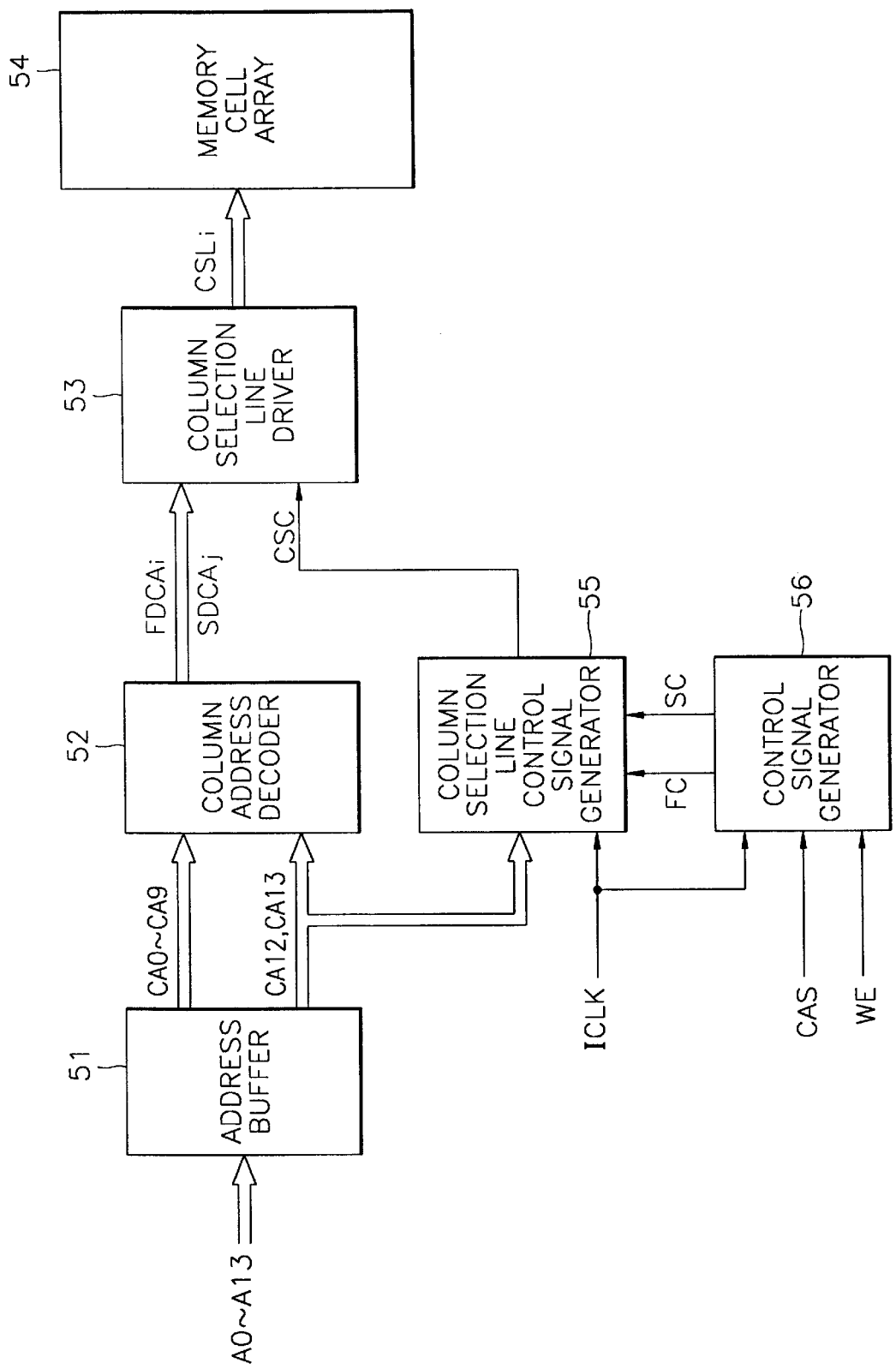
FIG. 5 is a block diagram schematically illustrating a semiconductor memory device according to a preferred embodiment of the present invention.

Referring to FIG. 5, the semiconductor memory device according to a preferred embodiment of the present invention includes an address buffer 51, a column address decoder 52, a column selection line driver 53, a column selection line control signal generator 55, a control signal generator 56, and a memory cell array 54.

The address buffer 51 buffers externally-input addresses $A_0$ through $A_{13}$, and outputs buffered column addresses. The column address decoder 52 receives outputs $CA_0$ through $CA_9$, $CA_{12}$, and $CA_{13}$ among the buffered column addresses via column address lines, decodes the same, and outputs first and second decoded column addresses $FDCA_i$ and $SDCA_i$ (where, i is an integer). The column selection line driver 53 includes a plurality of unit column selection line drivers, receives the first and second decoded column addresses $FDCA_i$ and $SDCA_i$, and drives column selection lines $CSL_i$ (where, i is an integer) in response to a column selection line control signal CSC. The column selection lines $CSL_i$ are then provided to the memory cell array 54.

$CA_{12}$ and $CA_{13}$ denote bank selection bits for when the memory cell array 54 includes a plurality of banks. The first decoded column address $FDCA_i$ denotes a signal chosen from among signals obtained by decoding $CA_0$ through $CA_2$ in the column address decoder 52, and the second decoded column address $SDCA_i$ denotes a signal chosen from among signals obtained by decoding $CA_3$ through $CA_9$ in the column address decoder 52.

In particular, the column selection line control signal generator 55 receives $CA_{12}$ and $CA_{13}$ and generates the column selection line control signal CSC in response to an internal clock signal ICLK and either a first or second control signal FC or SC. The control signal generator 56 generates the first and second control signals FC and SC in response to the internal clock signal ICLK and externally-input commands, e.g., a column address strobe signal CAS and a write enable signal WE.

The internal clock signal ICLK is generated in synchronization with an externally-input system clock signal CLK. In the preferred embodiment, the first control signal FC is generated in response to the column address strobe signal CAS and the internal clock signal ICLK, and the second control signal SC is generated in response to the write enable signal WE and the internal clock signal ICLK.

Figure 6:
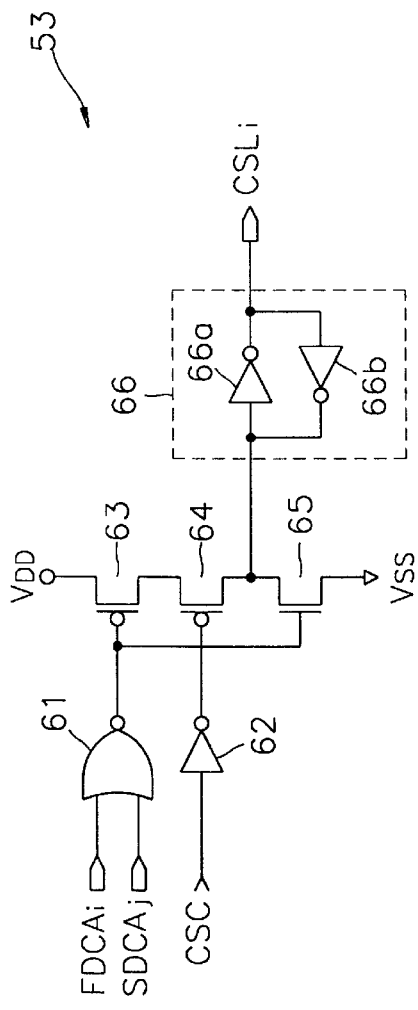
FIG. 6 is a circuit diagram of the column selection line driver shown in FIG. 5.

FIG. 6 is a circuit diagram of a unit column selection line driver included in the column selection line driver 53 shown in FIG. 5. Referring to FIG. 6, the unit column selection line driver includes a NOR gate 61, an inverter 62, PMOS transistors 63 and 64, an NMOS transistor 65, and a latch 66 having inverters 66a and 66b. The PMOS transistors 63 and 64 and the NMOS transistor 65 are connected to each other in series between a power supply voltage $V_{DD}$ and a ground voltage $V_{SS}$.

The NOR gate 61 performs an OR operation with respect to one bit $FDCA_j$ from among the first decoded column addresses $FDCA_i$ and one bit $SDCA_j$ from among the second decoded column addresses $SDCA_i$, and inverts the result. When the output of the NOR gate 61 is at a logic "high" level, the NMOS transistor 65 is turned on, so that a column selection line CSL connected to the output terminal of the latch 66 is activated to logic "high." When the output of the NOR gate 61 is at a logic "low" level and the column selection line control signal CSC is at a logic "high" level, the PMOS transistors 63 and 64 are turned on, so that the column selection line is deactivated to logic "low."

Figure 7:
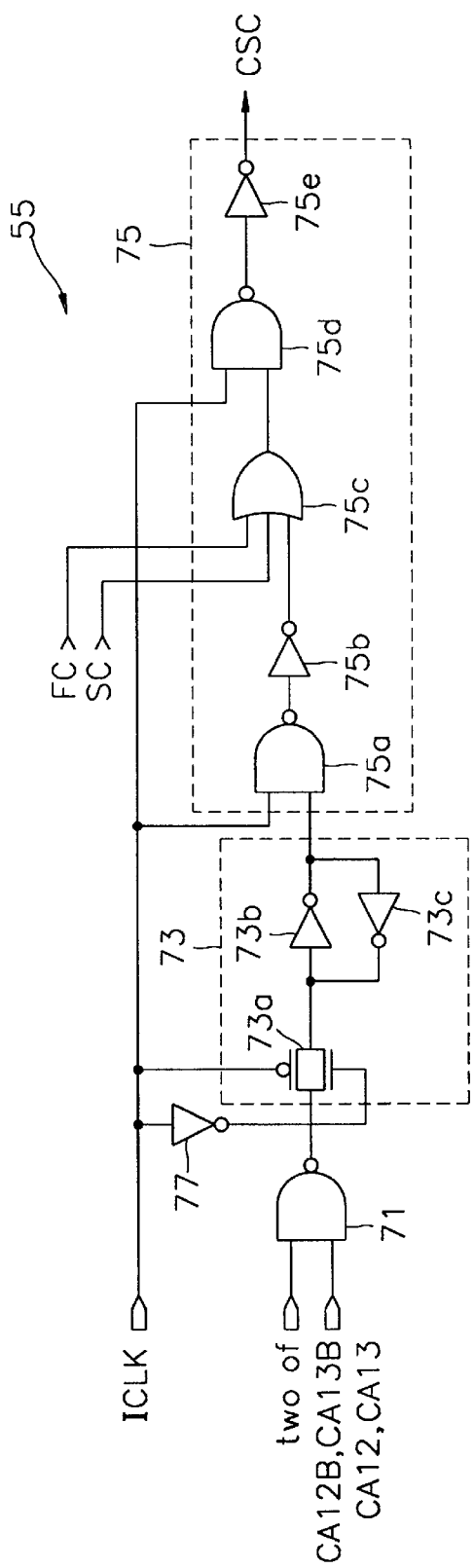
FIG. 7 is a circuit diagram illustrating the column selection line control signal generator shown in FIG. 5.

FIG. 7 is a circuit diagram illustrating the column selection line control signal generator shown in FIG. 5. Referring to FIG. 7, the column selection line control signal generator includes a NAND gate 71 for receiving two signals from among the column addresses $CA_{12}$ and $CA_{13}$ and the inverted column addresses /$CA_{12}$ and /$CA_{13}$, a latch 73 for latching the output of the NAND gate 71 in response to the internal clock signal ICLK, and a logic unit 75 for performing a logical operation with respect to the output of the latch 73 and the first and second control signals FC and SC, in response to the internal clock signal ICLK, and generates the column selection line control signal CSC.

The latch 73 includes inverters 73b and 73c, and a transmission gate 73a, which is controlled by the internal clock signal ICLK. The logic unit 75 includes a first NAND gate 75a for receiving the output of the latch 73 and the internal clock signal ICLK, a first inverter 75b for inverting the output of the NAND gate 75a, an OR gate 75c for receiving the output of the first inverter 75b and the first a and second control signals FC and SC, a second NAND gate 75d for receiving the output of the NOR gate 75c and the internal clock signal ICLK, and a second inverter 75c for inverting the output of the NAND gate 75d and outputting the column selection line control signal CSC.

Figure 8:
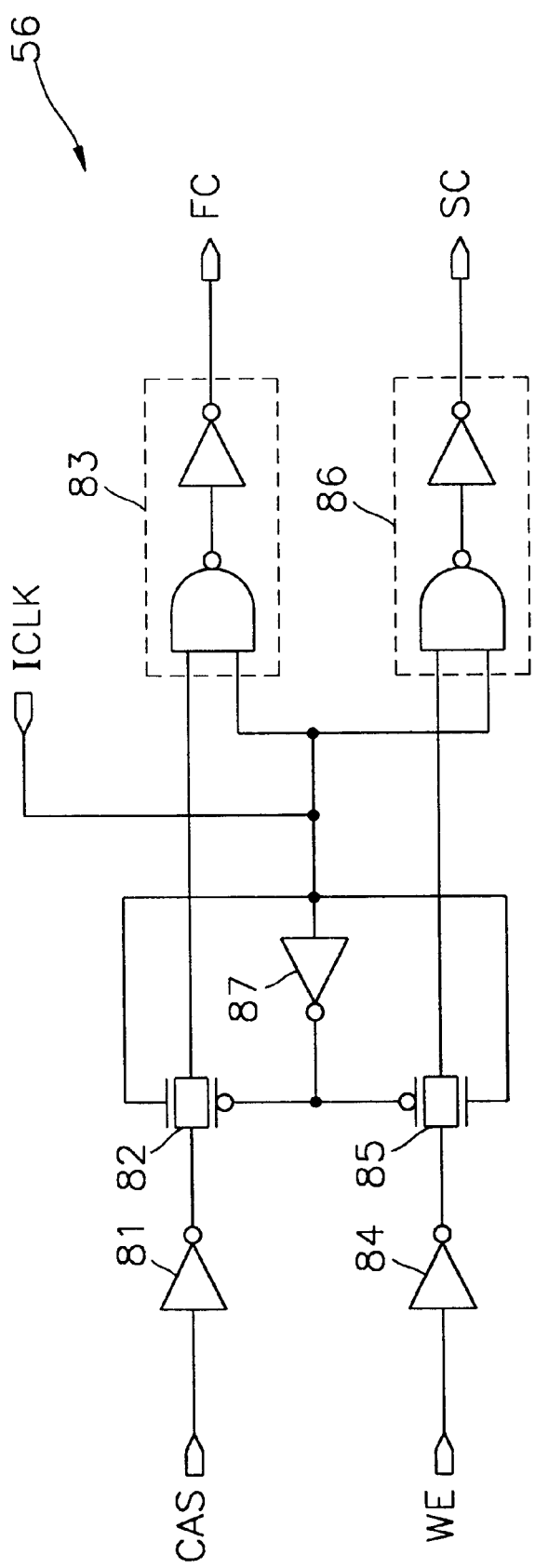
FIG. 8 is a circuit diagram illustrating the control signal generator shown in FIG. 5.

FIG. 8 is a circuit diagram illustrating the control signal generator 56 shown in FIG. 5. Referring to FIG. 8, the control signal generator 56 includes a first inverter 81, a first transmission gate 82, a first AND gate 83, a second inverter 84, a second transmission gate 85, a second AND gate 86.

The first inverter 81 inverts the column address strobe signal CAS. The first transmission gate 82 is turned on when the internal clock signal ICLK is at a logic "high" level, and transfers the output of the first inverter 81. The first AND gate 83 performs an AND operation with respect to the internal clock signal ICLK and the output of the first transmission gate 82, and outputs the result as the first control signal FC.

The second inverter 84 inverts the write enable signal WE. The second transmission gate 85 is turned on when the internal clock signal ICLK is at a logic "high" level, and transfers the output of the second inverter 84. The second AND gate 86 performs an AND operation with respect to the internal clock signal ICLK and the output of the second transmission gate 85, and outputs the result as the second control signal SC.

Upon read-out, the column address strobe signal CAS becomes logic "low" for a duration of about one cycle of the internal clock signal ICLK. Accordingly, while the column address strobe signal CAS is at a logic "low" level, i.e., while the output of the first inverter 81 is at a logic "high" level, a logic "high" pulse in the internal clock signal ICLK is output as the first control signal FC.

Similarly, upon writing, the write enable signal WE becomes logic "low" for a duration of about one cycle of the internal clock signal ICLK. Accordingly, while the write enable signal WE is at a logic "low" level, i.e., while the output of the second inverter 84 is at a logic "high" level, a logic "high" pulse in the internal clock signal ICLK is output as the second control signal SC.

Figure 9:
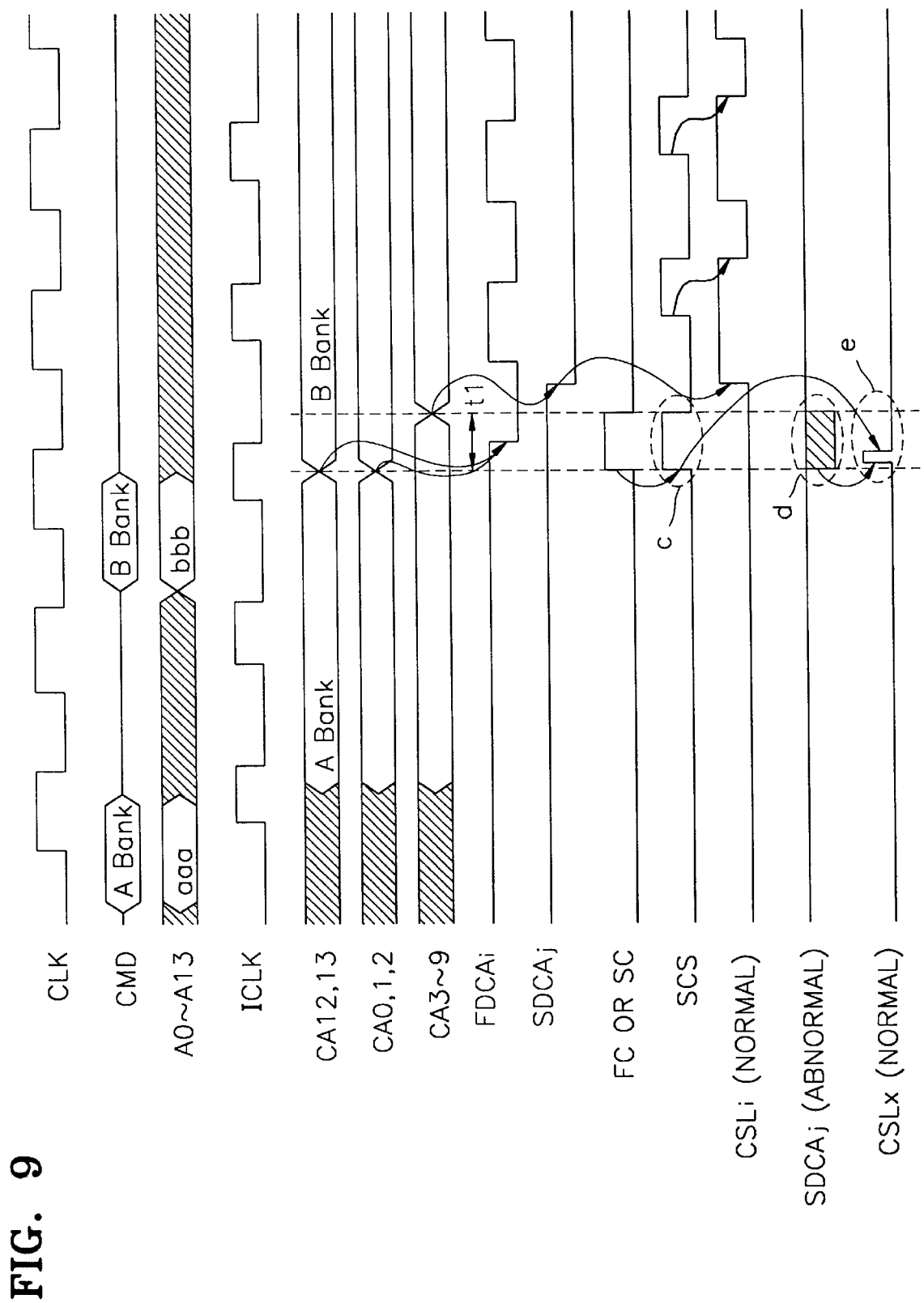
FIG. 9 is a timing diagram illustrating the signals shown in FIG. 5.

FIG. 9 is a timing diagram illustrating the signals shown in FIG. 5. The operation of the semiconductor memory device according to a preferred embodiment of the present invention will now be further described with reference to the timing diagram of FIG. 9. In particular, a case in which a B bank in the memory cell array 54 is selected will be described.

Initially, a system clock signal CLK, a write or read command CMD, and column addresses $A_0$ through $A_{13}$ are applied from outside of the DRAM. The internal clock signal ICLK is then generated to have a synchronous relationship with the system clock signal CLK. Also, the address buffer 51 buffers the column addresses $A_0$ through $A_{13}$ and outputs buffered column addresses $CA_i$ (where i is an integer between 0 and 13), and the column address decoder 52 receives $CA_0$ through $CA_9$ and $CA_{12}$ and $CA_{13}$ among the buffered column addresses via column address lines. The column address decoder 52 then decodes the received signals and outputs the first and second decoded column addresses $FDCA_i$ and $SDCA_i$.

Meanwhile, the control signal generator 56 generates the first or second control signal FC or SC in response to the internal clock signal ICLK and the command CMD, i.e., the column address strobe signal CAS or the write enable signal WE. To be more specific, upon read-out, the first control signal FC, which has the format of a pulse signal, is generated in response to the column address strobe signal CAS and the internal clock signal ICLK. Upon writing, the second control signal SC, which has the format of a pulse signal, is generated in response to the write enable signal WE and the internal clock signal ICLK.

Accordingly, the column selection line control signal generator 55 receives the column address signals $CA_{12}$ and $CA_{13}$ and generates the column selection line control signal CSC in response to the internal clock signal ICLK and either the first or second control signal FC or SC. Therefore, the column selection line control signal CSC has a pulse, as indicated by the area c, which is generated by the first or second control signal FC or SC.

As described above, as the level of integration of a DRAM increases, the column address lines that transmit the buffered column addresses $CA_0$ through $CA_9$ and $CA_{12}$ and $CA_{13}$, may be greatly loaded, and the loads on the column address lines may differ from one another. In this case, for example, one among $CA_i$ (where i is an integer ranging from 0 to 9) may be delayed for a period of $t_1$ with respect to $CA_{12}$ and $CA_{13}$, as shown in FIG. 9, because of the difference between the loads of the column address lines.

FIG. 9 shows a case in which one among $CA_3$ through $CA_9$ is delayed for a period of $t_1$. Accordingly, one among the second decoded column addresses $SDCA_i$, which are generated by $CA_3$ through $CA_9$, i.e., $SDCA_j$, has invalid data, as indicated by the area d, for a period of $t_1$. Thus, one among the column selection lines $CSL_i$, i.e., $CSL_x$, is abnormally enabled to logic "high" in advance, as indicated by the area e.

However, in the semiconductor memory device according to a preferred embodiment of the present invention, the column selection line $CSL_x$ is disabled to logic "low" by the rising edge of the pulse of the column selection line control signal CSC (as shown by area c). Thus, the column selection line $CSL_x$ has only a narrow pulse having a small area, as indicated by the area e, so that two column selection lines are not enabled simultaneously, and a malfunction of the semiconductor memory device is prevented.

As described above, the semiconductor memory device according to the present invention operates normally and is unaffected in operating speed, even when column address lines for transmitting column addresses are greatly loaded and the loads on the column address lines are different from one another.

Although the invention has been described with reference to a particular embodiment, it will be apparent to one of ordinary skill in the art that modifications of the described embodiment may be made without departing from the spirit and scope of the invention.

What is claimed is:

1. A semiconductor memory device comprising:
   a memory cell array;
   a column selection line driver for receiving decoded addresses and driving column selection lines of the memory cell array in response to a column selection line control signal;
   a control signal generator for generating first and second control signals in response to an internal clock signal, an externally-input column address strobe signal, and an externally-input write enable signal; and
   a column selection line control signal generator for receiving first and second buffered column address data and generating the column selection line control signal in response to the internal clock signal and one of the first and second control signals.

2. A semiconductor memory device, as recited in claim 1, further comprising:
   an address buffer for buffering externally input column addresses and outputting the first and second buffered column address data; and a column address decoder for receiving and decoding the first and second buffered column address data and outputting the decoded addresses.

3. A semiconductor memory device, as recited in claim 1, wherein the internal clock signal has a synchronous relationship with an externally-input system clock signal.

4. A semiconductor memory device, as recited in claim 1, wherein the first control signal is generated in response to the column address strobe signal and the internal clock signal.

5. A semiconductor memory device, as recited in claim 1, wherein the second control signal is generated in response to the write enable signal and the internal clock signal.

6. A semiconductor memory device, as recited in claim 1, wherein the column selection line control signal generator comprises:
- a NAND gate for selectively receiving the second buffered column address data and the inverted signals of the buffered column address data;
- a latch for latching the output of the NAND gate in response to the internal clock signal; and
- a logic unit for performing a logic operation with respect to the output of the latch and the first and second control signals, in response to the internal clock signal.

7. A semiconductor memory device, as recited in claim 6, wherein the first buffered column address data includes the $0^{th}$ through $9^{th}$ bits of the column address, and the second buffered column address data includes the $12^{th}$ and $13^{th}$ bits of the column address.

8. A semiconductor memory device, as recited in claim 1, wherein the control signal generator comprises:
- a first inverter for inverting the column address strobe signal;
- a first switch for transferring the output of the first inverter in response to the internal clock signal;
- a first AND gate for performing an AND operation with respect to the internal clock signal and the output of the first switch, and outputting the result as the first control signal;
- a second inverter for inverting the write enable signal;
- a second switch for transferring the output of the second inverter in response to the internal clock signal; and
- a second AND gate for performing an AND operation with respect to the internal clock signal and the output of the second switch, and outputting the result as the second control signal.

* * * * *